(12) United States Patent
Quint et al.

(10) Patent No.: US 7,750,639 B2
(45) Date of Patent: Jul. 6, 2010

(54) BATTERY MANAGEMENT SYSTEM WITH PREDICTIVE FAILURE ANALYSIS

(75) Inventors: Jonathan B. Quint, Sudbury, MA (US); Steven H. Dworkin, Newton, MA (US)

(73) Assignee: Batterycorp, Inc., Newton, MA (US)

( * ) Notice: Subject to any disclaimer, the term of this patent is extended or adjusted under 35 U.S.C. 154(b) by 304 days.

(21) Appl. No.: 11/491,807

(22) Filed: Jul. 24, 2006

(65) Prior Publication Data

US 2006/0284619 A1    Dec. 21, 2006

Related U.S. Application Data

(63) Continuation-in-part of application No. 11/125,450, filed on May 10, 2005, which is a continuation-in-part of application No. 10/749,004, filed on Dec. 30, 2003, now Pat. No. 7,003,431.

(51) Int. Cl.
*G01N 27/416* (2006.01)
*G08B 21/00* (2006.01)

(52) U.S. Cl. .................. 324/426; 324/433; 340/636.1

(58) Field of Classification Search .................. 324/426, 324/427, 430, 432; 702/63, 182, 183; 320/106, 320/107, 109, 116; 340/635, 636.1
See application file for complete search history.

(56) References Cited

U.S. PATENT DOCUMENTS

| | | | |
|---|---|---|---|
| 4,222,665 A | 9/1980 | Tachizawa et al. | 356/218 |
| 5,250,904 A | 10/1993 | Salander et al. | 324/430 |
| 5,543,245 A * | 8/1996 | Andrieu et al. | 429/90 |
| 5,545,967 A | 8/1996 | Osborne et al. | 320/2 |
| 5,646,509 A * | 7/1997 | Berglund et al. | 713/321 |
| 6,051,976 A * | 4/2000 | Bertness | 324/426 |
| 6,353,800 B1 | 3/2002 | Rector | 702/63 |
| 6,456,036 B1 | 9/2002 | Thandiwe | 320/106 |
| 6,967,890 B2 * | 11/2005 | Shen | 365/226 |
| 7,003,431 B2 | 2/2006 | Quint et al. | 702/183 |
| 7,277,889 B2 * | 10/2007 | Addonisio et al. | 707/10 |
| 2004/0051532 A1* | 3/2004 | Smith et al. | 324/426 |
| 2004/0251907 A1 | 12/2004 | Kalley | 324/426 |
| 2005/0001627 A1 | 1/2005 | Anbuky et al. | 324/427 |
| 2005/0071093 A1 | 3/2005 | Stefan | 702/60 |
| 2006/0017582 A1* | 1/2006 | Lockhart et al. | 340/636.1 |

OTHER PUBLICATIONS

Office action in U.S. Appl. No. 10/749,004, filed May 23, 2005.
Notice of Allowability in U.S. Appl. No. 10/749,004, filed Nov. 21, 2005.

* cited by examiner

*Primary Examiner*—Edward Tso
*Assistant Examiner*—M'Baye Diao
(74) *Attorney, Agent, or Firm*—Peter S. Canelias

(57) ABSTRACT

The invention relates to the management of large stationary batteries. The invention is a comprehensive system and process for the management of stationary batteries that are used for backup power and are deployed in widely dispersed locations. The system is comprised of Mega-Tags, a battery testing and data acquisition device, and web-based software. The system software can automatically analyze, determine and report predicted battery failure data such as a future anticipated failure date by aging standard ohmic test values such as impedance, conductance, or resistance, by multiplying the test value by a monthly factor derived from statistical analysis and comparing the aged value to a baseline value to determine the predicted failure date.

24 Claims, 3 Drawing Sheets

BATTERY MANAGEMENT SYSTEM WITH PREDICTIVE FAILURE ANALYSIS

CROSS REFERENCE TO RELATED APPLICATIONS

This application is a continuation-in-part of, and claims priority to, U.S. application Ser. No. 11/125,450, filed May 10, 2005, related to U.S. application Ser. No. 11/125,631, filed May 10, 2005, related to U.S. application Ser. No. 11/025,816, filed Dec. 29, 2004, related to U.S. application Ser. No. 11/025,305, filed Dec. 29, 2004, each of the foregoing applications being continuations-in-part of U.S. application Ser. No. 10/749,004, filed Dec. 30, 2003 (now U.S. Pat. No. 7,003,431, issued Feb. 21, 2006), and all of the foregoing being incorporated herein by reference in their entirety.

BACKGROUND OF THE INVENTION

The invention relates to the management of large stationary batteries, and incorporates a method of predictive battery failure analysis to enable users to more accurately estimate the useful life of a battery or series of batteries. The invention is preferably employed within a comprehensive system and apparatus for the management of stationary batteries that are used for backup power and are deployed in widely dispersed locations. The apparatus and system preferably is comprised of battery tags, sometimes referred to herein as "Mega-Tags," which are preferably serialized bar-coded identification labels or radio frequency identification (RFID) tags, a battery testing and data acquisition device compatible with the type or types of Mega Tags employed, and web-based software (a part of the OMS® battery management system) to perform the method and yield the useful result back to the user, to a field technician or to any other designated recipients. These components work together to provide a platform for managing a large number of perishable, expensive, and geographically dispersed assets and plan for the anticipated failure of the units.

Thus the invention solves one of the most important problems associated with batteries. Batteries are perishable, and predicting their useful lifespan to help manage servicing schedules, replacement cost and budgeting for uninterrupted power service. Stationary industrial batteries of the type that benefit from the invention are typically sealed lead-acid batteries. These electromechanical devices typically must be installed within 6-10 months from date of manufacture or else they need to be recharged. In addition, most of these batteries are designed for a 10 year useful life, but in the field generally last only from 2-6 years. The discrepancy between design life and actual life is a major problem for users of these batteries.

Batteries are generally deployed in strings or units of two or four 12-volt jars, in strings of three 12-volt jars, or in strings of six or twelve 2-volt jars, in order to power 24 volt, 36 volt or 48 volt equipment. Other string configurations are also possible. This electrical combination of batteries compounds the difficulty of managing these storage devices. In sum, managing stationary batteries is difficult, and is generally not a core competency of most businesses that use these batteries.

In order to have visibility into the state of health of a stationary battery plant, it is necessary to periodically test the batteries. Upon testing, gross failure of the batteries is apparent, as would be an impending failure within a short time horizon, such as a week or two. These short-term indicia of impending battery failure do not allow planning and budgeting to replace critical power assets.

In many cases, even where the batteries are in good condition there may be a deficiency of backup power due to changes in load requirements. This situation occurs frequently in many industries. For example, in a wireless telecommunications application, a battery backup plant might initially provide four hours of runtime; yet over time as additional communications gear is added to the transmission location, the batteries have to power a greater load and therefore provide less runtime. (Note that "runtime" refers to the length of time that the backup system can provide adequate power to keep the primary equipment operational.)

Prior methods of predicting battery failure are limited to predicting an imminent failure by monitoring a battery jar. For example, U.S. Pat. No. 5,250,904 to Salander et al. provides a prediction of imminent battery failure by means of monitoring a slight change in voltage across the cell or battery terminals, while it is in "float" service, i.e., neither charging or discharging under use. Again, such a short horizon of impending battery failure does not allow planning and budgeting to replace critical power assets.

BRIEF SUMMARY OF THE INVENTION

The OMS® system can track batteries from cradle-to-grave. It enables companies with large deployments of stationary batteries to manage assets that are both perishable and geographically dispersed, and therefore difficult to manage. Batteries are usually deployed in "strings" of electrically interconnected jars or clusters to increase voltage and output power. Each battery test data point is stored along with the unique identifier value associated with the individual battery jar, or, alternatively, a unique identifier associated with an individual string. A "battery unit" is defined herein as either an individual battery jar or a battery string. Where the tags associated with the batteries are bar codes, the user would preferably connect a BatteryCorp BC-T2000 or BC Celltron Ultra or similar testing device to the serial port of a PC with the provided null-modem cable or by means of other compatible communication interface, whether wired or wirelessly connected. Linking software, preferably the T2000 Link or Celltron Receive Utility Software facilitates the transfer of data from the testing and data acquisition device preferably to a local data storage device. The user would then logs into the proprietary website and clicks on the Upload Data icon; the software would then upload the specified data file to a proprietary web server. The web server processes the data file, storing the pertinent data in the appropriate tables of a database. The data may also be uploaded wirelessly, as is well known in the art, via any of the wireless transmission apparatus and protocols available and compatible with the other system components.

The predictive battery failure analysis and method is implemented as follows. A technician performs battery testing on an individual battery jar, or receives the test data from a self-actualizing testing and transmission device coupled to the battery. Individual battery jars are uniquely identified by the battery-testing device or the unique identification is received from a tag associated with the battery unit. The testing device connects to a computer network either by wire or wirelessly. When the network connection is a wireless network connection, a variety of wireless protocols might be used, such as IEEE 802.11x, IEEE 802.16, IEEE 802.20, code division multiple access ("CDMA"), time division multiple access ("TDMA"), frequency division multiple access ("FDMA"), Global System for Mobile Communications/General Packet Radio Service ("GSM/GPRS"), Bluetooth or others. Two of the more common standards for RF communication include the Bluetooth protocol and the 802.11(b) protocol. The data may be uploaded either from a PC to the database or directly from the testing device to the database.

The system database acquires and processes the test information as follows. The then-current battery unit state of health is measured by an industry-standard ohmic test which measures impedance, conductance, and/or resistance. Any one of these measurements will indicate the general then-current state of health of the unit. The system estimates the future state of health by inference based on statistical analysis. The future state of health is inferred by adjusting the test readings to "age" them according to the following logic: the ohmic test reading is multiplied by a factor; the factor is a monthly factor for the particular battery make and model; the monthly factor is derived from statistical analysis of previous ohmic test readings of the same battery make and model.

Previous ohmic tests are categorized by age of the battery, at the time of the test, into categories of 1-2 years, 2-3 years, 3-4 years, more than 4 years. Batteries under one year old are excluded because predictive analysis assumes that any battery jars will last for at least one year. This is true of any battery technology used for stationary battery deployment.

Analyses of previous ohmic tests are used to compute a monthly change factor for each make and model, for each temporal category as described above. The appropriate monthly factor is used for any given jar, depending upon the make and model and the current age of the jar. The monthly projected future state-of-health values are compared to customer business rules, where the customer business rules employ a percentage change from baseline ohmic value.

Utilizing the factors and the current ohmic test results, the data is "aged" to the point at which the projected ohmic value will exceed the customer specification for end of life. The point at which the customer business rules indicate end-of-life is reported. The invention therefore can predict an estimated end-of-life for customers based upon the specific battery deployments and the customer's business rules. This result is uniquely valuable for anticipating and preventing a non-immediate power failure and for budget forecasting for additional battery resources.

Other objects and advantages will be more fully apparent from the following disclosure and appended claims.

BRIEF DESCRIPTION OF THE DRAWINGS

The above-mentioned and other features and objects of this invention and the manner of obtaining them will become apparent and the invention itself will be best understood by reference to the following description of an embodiment of the invention taken in conjunction with the accompanying drawings, wherein.

DETAILED DESCRIPTION

The invention provides and coordinates battery testing, maintenance, installation, fulfillment and disposal of batteries, and is capable of performing these functions over a wide geographical area. It seamlessly integrates these services via ohmic testing devices and the web based platform. This innovative solution helps companies improve their backup power systems while reducing costs. The system preferably employs Mega-Tags to be associated with an individual battery jar or with a battery string, a string here defined as a plurality of electrically connected battery jars, treating the battery string as a battery unit. The tag is associated with a particular battery unit, so that the unique identification number embedded in the tag is consistently associated with that particular battery unit.

Figure 1:
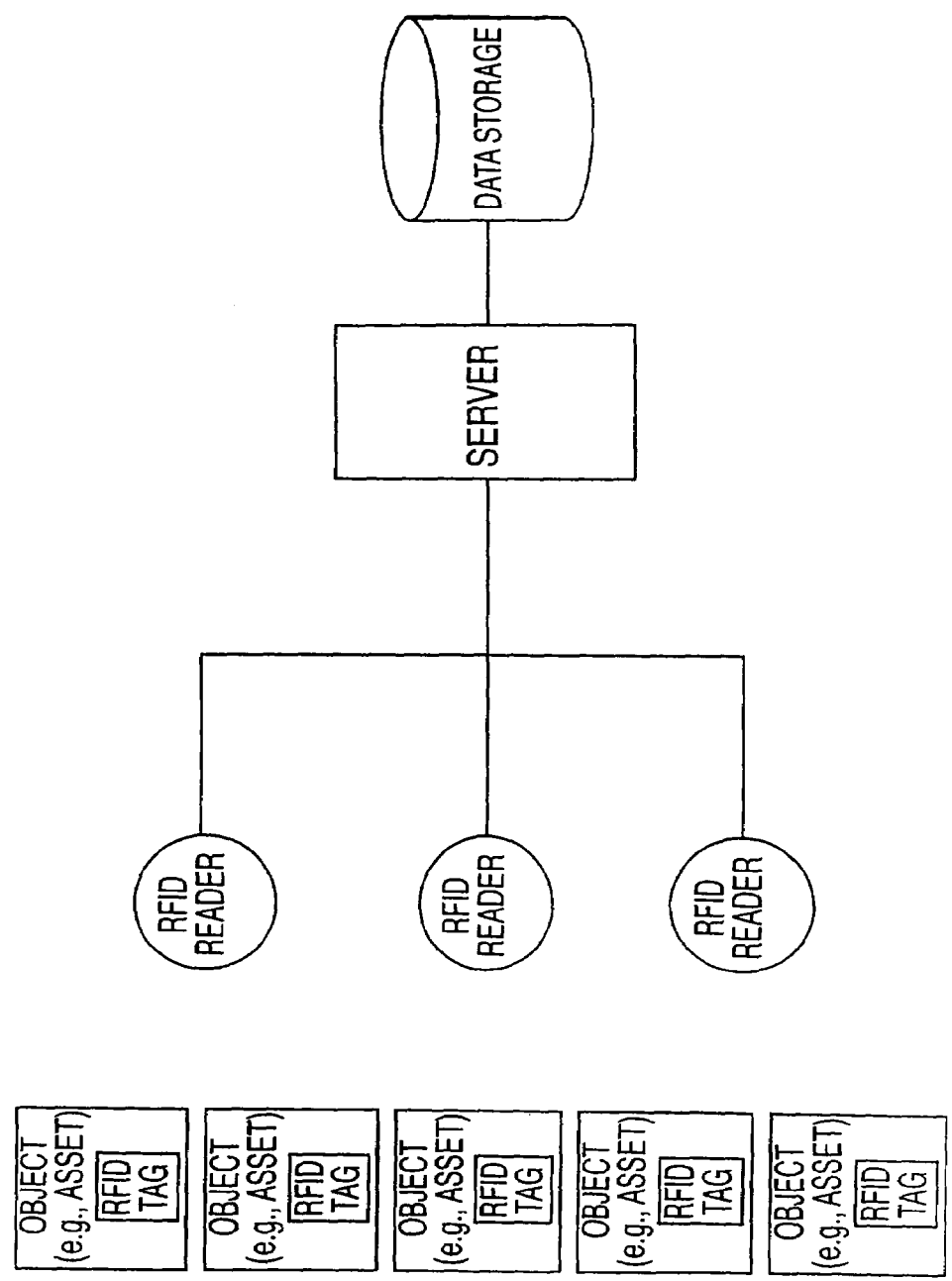
FIG. 1 is a representation of a prior art RFID tag system for use with the present invention.
Figure 2:
FIG. 2 is a representation of a tag for use with the present invention.
Figure 3:
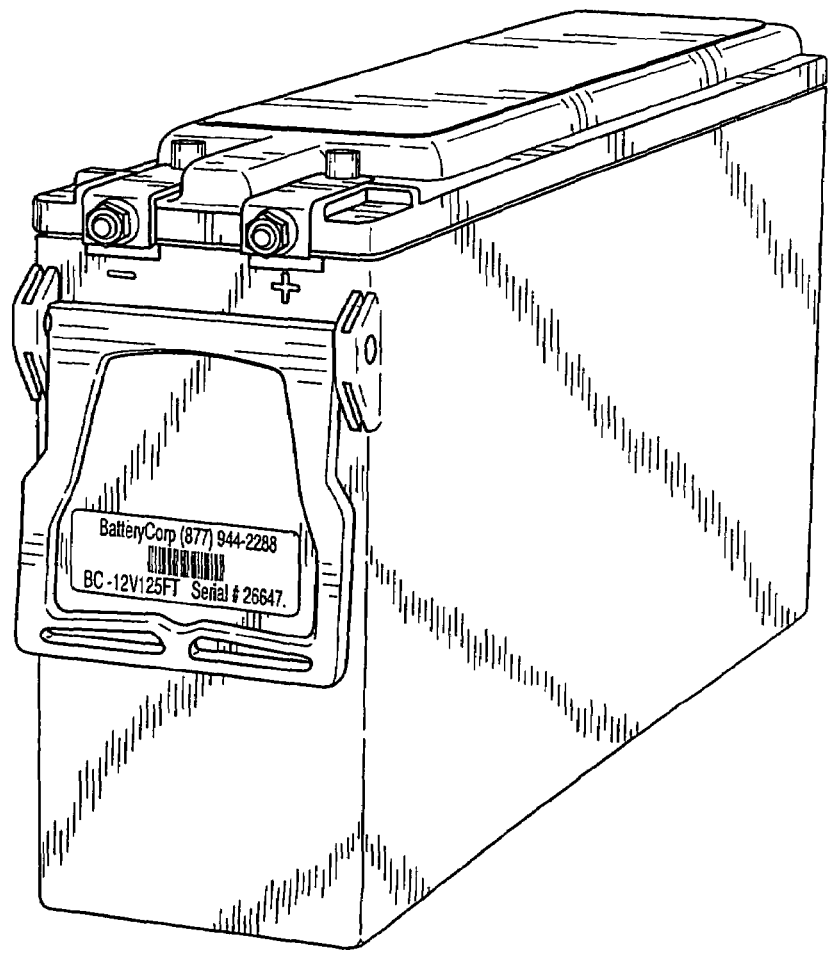
FIG. 3 is a perspective view of a battery unit with a tag associated with the battery.
Figure 4:
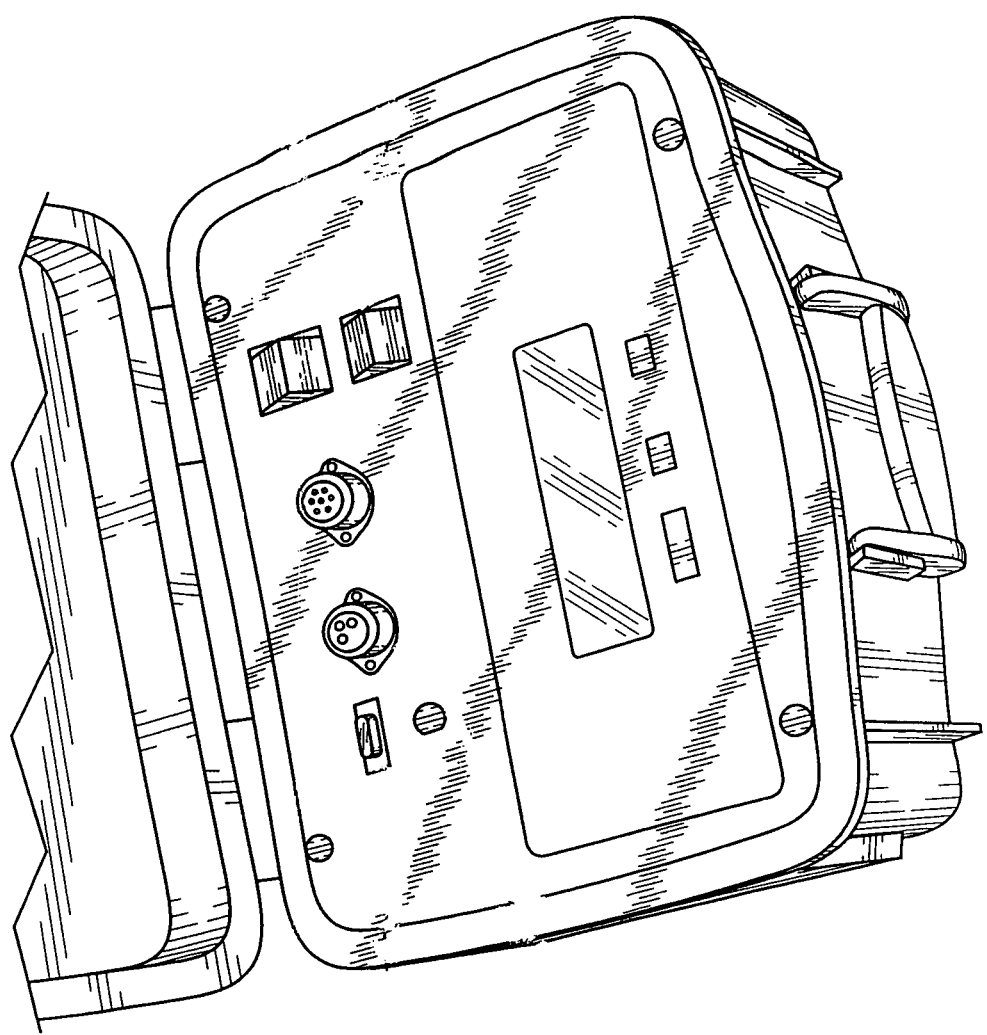
FIG. 4 is a view of a battery testing and data acquisition device for use with the present invention.

Mega-Tags are preferably bar coded labels or RFID tags that contain a unique identifier for the associated battery unit. FIG. 1 shows an RFID system, having an array of battery units which may be individual jars or battery strings (both denoted here as objects or assets), each unit having an RFID tag associated with the individual asset. A plurality of RFID readers is shown, in this example the number of RFID readers being less than the number of objects. The RFID readers are in communication with a server, which in turn is in communication with data storage for storing the acquired information. A Mega-Tag preferably has the following information: (1) the service provider name and telephone number; (2) the battery model; and (3) a unique identification. Where a bar code is used as a Mega-Tag, the unique identification is preferably in human readable form, and the Mega-Tag is preferably affixed where it can be viewed and scanned by a human operator without dislocating the battery.

In particular, the battery tester should be able to store test results in memory, associating each test with the pertinent unique scanned identifier. The tester also should be able to output the test results in an industry-standard file format, such as ASCII text or Excel XLS. The tester should be able to perform impedance conductance or resistance testing (IEEE approved technologies). Many companies that utilize stationary batteries perform impedance, conductance and/or resistance tests. These test types are called ohmic testing. Many companies that utilize stationary batteries perform ohmic testing.

In an alternative embodiment, the tester may operate with an infra-red thermometer, either integrated with the battery tester or otherwise in communication with the tester. The thermometer would read the temperatures of individual batteries, and the temperature associated with the unique identifier for that particular unit. Such a thermometer would provide additional information concerning the subject battery unit that would be read, uploaded and stored. Such a thermometer would obviate the need for a separate thermometer to record ambient temperature surrounding the battery units, which is stored along with the battery test data, and provide a more accurate reading of individual unit temperatures.

The testing device files preferably have the following header information. First, a Location Code is included with the file. This is a code that links the database of the invention, indicating the location of the battery. Second, the ambient temperature is stored along with the test information, because battery temperature is correlated with life expectancy. This information is also required by many battery manufacturers for warranty claims.

The testing device files preferably have the following detail information. First, there is a Unique Identifier that identifies the individual battery unit. Second, the date and time of the test are included in the file. Third, the test value, which is the individual battery unit test result, typically either an impedance value or a conductance value or a resistance value. It is the key indicator of the battery's health. The greater the impedance or the lower the conductance (they are inverse measurements of the same attribute) or the greater the resistance value, the poorer the state of health of the battery.

Database management is another component of the present invention. Each battery test data point is stored along with the unique identifier value associated with the individual battery unit. This enables trend analysis reporting and individual battery detail reporting.

In operation, the user connects the battery testing device to the serial or USB (Universal Serial Bus) port of a PC with a null-modem cable, a standard computer peripheral device which is readily available, or with any other compatible interface device. The linking software facilitates the transfer of data from the testing and data acquisition device to the PC internal storage. Typically, the user clicks the "Transfer" button displayed on the graphical user interface (GUI) of the software. The response will be "Waiting for data." Prompts on the battery tester will guide the user to the menu option for downloading the data.

The user then logs in to the proprietary service provider website. The user will then click on the Upload Data icon displayed within the GUI. The linking software then uploads the specified data file to a proprietary web server. The web server processes the data file, storing the pertinent data in the appropriate tables of the OMS® database.

Typical data elements stored include:
a. Unique ID
b. ID of the user who performed the test
c. Test date and time
d. Test type (Impedance, Conductance or Resistance)
e. Test measurement value
f. Strap measurement value if applicable
g. Voltage
h. Ambient temperature The invention then generates comprehensive reporting and analysis, including preferably the following:
a. Battery Test History (detail by location)
b. Battery Test Summary (overview of tests and results)
c. Untested Batteries (verification tool)
d. Battery Installation Aging (based upon installation date)
e. Performance Status Report (analysis which groups batteries based upon user-defined status criteria for "pass", "fair", "warning" and "fail")
f. Replacement Forecast (analysis based upon user-defined criteria to estimate costs of upcoming replacements)
g. Predictive Battery Unit Failure Date Of these, the impedance, conductance or resistance test data (ohmic test data) are used in determining the predicted battery unit failure date.

Auto-notification is another part of the present invention. This feature is based upon customer-defined business rules. Business rules are a set of decision points that the customer or end user agrees to in advance, i.e., are pre-selected. The pre-selected rules indicate that specific battery jars and/or an entire battery string would require replacement. Individual state-of-health measurements for specific jars or a string are compared to the baseline, or standard, for a state-of-health by battery make and model is one example of the application of business rules. Deviation in state-of-health of a battery jar from the average measurement of other jars in the battery string is another example. These rules typically include test interval and escalation procedures, automatic battery replacement intervals and escalation procedures. These business rules can be specified by customer-defined business units. Business units might be geographical areas, product line groupings, etc. This provides considerable flexibility for the user in how to utilize the automated notification process and the predictive battery failure method. All notifications are preferably made via email or other electronic transmission means.

The software can send an automated email notification to the pertinent technician that various locations require battery testing. This process is called Auto Notification. The person that is informed of the required testing can be either an internal (i.e. employee of the customer company) or an outsourced (third party) technician. This Auto Notification feature is not required for functioning of the present invention, since users may utilize the software with this feature disabled, and set up their testing schedule separately.

The technician tests the batteries with the batter tester and uploads the data via a network connection, preferably a global computer network such as the Internet, to the proprietary database, preferably located on a server. Upon receipt of uploaded data files, the software immediately processes the data and sends an automated report (Auto Report) back to the technician. The report will indicate whether the batteries all "Passed," or if any "Failed" the test. The report may include predictive battery unit failure data, including an anticipated future failure date for each battery jar or string. The report may also provide instructions to the technician on whether or not to replace any given battery or all batteries, depending upon the business rules for that customer (Auto Replacement). If Auto Replacement is enabled, the software will route the appropriate information to the pertinent installation technician. The software may provide recycling documentation, so that batteries being replaced may be properly recycled.

The predictive battery failure analysis and method is implemented as follows. A technician performs battery testing on an individual battery jar, or receives the test data from a self-actualizing testing and transmission device coupled to the battery. Any of these types of devices will function as battery testing devices. Battery units comprising either an individual battery jar or a plurality of jars in a string are uniquely identified by the battery-testing device or the unique identification is received from a tag associated with the battery unit. The testing device connects to a computer network either by wire or wirelessly. When the network connection is a wireless network connection, a variety of wireless protocols might be used, such as IEEE 802.11x, IEEE 802.16, IEEE 802.20, code division multiple access ("CDMA"), time division multiple access ("TDMA"), frequency division multiple access ("FDMA"), Global System for Mobile Communications/General Packet Radio Service ("GSM/GPRS"), Bluetooth or others. Two common standards for RF communication include the Bluetooth protocol and the 802.11(b) protocol. The data may be uploaded either from a PC to the database or directly from the testing device to the database. The database processes the test information as follows:

The then-current battery state of health is measured by an industry-standard ohmic test which measures impedance, conductance, or resistance. Any one of these measurements will indicate the general then-current state of health of the unit. The future state of health is inferred by adjusting the test readings to "age" them according to the following logic: the ohmic test reading is multiplied by a factor; the factor is a monthly factor for the particular battery make and model; the monthly factor is derived from statistical analysis of previous ohmic test readings of the same battery make and model.

Previous ohmic tests are categorized by age of the battery, at the time of the test, into categories of 1-2 years, 2-3 years, 3-4 years, more than 4 years. Batteries under one year old are excluded because predictive analysis assumes that any battery jars will last for at least one year. This is true of any battery technology used for stationary battery deployment.

Analyses of previous ohmic tests are used to compute a monthly change factor for each make and model, for each temporal category as described above. The appropriate monthly factor is used for any given jar, depending upon the make and model and the current age of the jar. The monthly projected future state-of-health values are compared to customer business rule, where the customer business rules employ a percentage change from baseline ohmic value.

Utilizing the factors and the current ohmic test results, the data is "aged" to the point at which the projected ohmic value will exceed the customer specification for end of life. The point at which the customer business rules indicate end-of-life is reported as predicted battery failure data such as a future anticipated failure date. The invention therefore can predict an estimated end-of-life for customers based upon the specific battery deployments and the user's business rules. This result is uniquely valuable for anticipating and preventing a non-immediate power failure and for budget forecasting for additional battery resources. The following sample data and analysis shows a typical implementation of the process or predictive battery failure analysis within the system of the invention:

Battery ID #12345678
Date Tested: Feb. 11, 2006
Test Type: Impedance
Test Measurement: 3.17 milliohms
Battery Type: Battery X
Battery Age: 2.3 years
Baseline: 2.539 milliohms
Business rule: Replace battery at 30% over baseline, which is 3.30 milliohms The following calculation illustrates the predictive battery failure analysis:
  3.17 milliohms on Feb. 11, 2006, jar age 2.3 years
  Per chart below, apply a 12% annual or 1% monthly impedance degradation
  Assumed impedance value on Mar. 11, 2006: 3.17×1.01=3.2017
  Assumed impedance value on Jun. 11, 2006: 3.17×1.01=3.2968
  Computed impedance value to exceed 3.30 on Jun. 14, 2006

| | | Sample Battery Aging Chart: | | | |
|---|---|---|---|---|---|
| Part No. | # Data Points | *** Annual Degradation, based on jar age ******** | | | |
| | | Year 1-2 | Year 2-3 | Year 3-4 | Year 4+ |
| Battery X | 26,077 | 8% | 12% | 15% | 18% |

The predictive battery failure data shown here ordinarily would comprise a predicted battery unit failure or replacement date. It will be understood by those skilled in the art that this is one possible method for predicting the desired replacement date. In this preferred embodiment, there is no data collected for degradation during the first year since it is assumed that all battery jars will perform for at least one year.

The software platform has been built using programming tools from Microsoft. The integrated development environment (IDE) includes productivity boosting features such as automated syntax management, a powerful editor, line-by-line debugging, graphical design tools (including visual classes and subclasses), and integrated database access. The platform is fully object-oriented, offering developers the benefits of full inheritance, encapsulation and polymorphism. This dramatically reduces design, coding, and testing times, producing a highly efficient rapid application development (RAD) environment.

The methodology employed in the software can be referred to as business function modeling (BFM). The entire orientation of the development effort revolves around the business rules and processes. This may also be referred to as an object functional model. Each function encapsulates a particular business task, yet from a development point of view it also inherits any and all system functions necessary to perform the intended task.) For example, a purchase order object would accept the request, access the necessary data, employ all pertinent business rules, validate the posted data, update the database, and generate a response—all within a single software object. This is a major architectural advantage.

Finally, the software platform contains a rich set of connectivity tools. It can easily import/export data in various formats, from plain text to delimited files to Excel to XML. In fact, the battery tester upload module accepts data in both text and XLS formats. The system can also directly access any ODBC compliant data source, such as Oracle, DB2 and other databases. However, we expect that the XML classes in particular will facilitate seamless communication between the OMS® and any related systems.

The specific products utilized to build the OMS® software are:
  Microsoft Visual FoxPro 7.0 (IDE)
  West Wind Web Connection (Base classes for web services)
  Macromedia HomeSite (HTML/JavaScript editor; any can be used)
  IDAutomation.com bar code fonts
  Adobe Acrobat 5.0

Web Connect by West Wind Technologies is a framework of base classes for building web applications. These classes perform all low-level functions for authentication, request management, session management, data formatting and output. It may be preferable to use updated versions of the above programs as they become available.

Since other modifications or changes will be apparent to those skilled in the art, there have been described above the principles of this invention in connection with specific apparatus, it is to be clearly understood that this description is made only by way of example and not as a limitation to the scope of the invention.

What is claimed is:

1. A battery management system comprising: a tag associated with a battery unit; said tag having a unique identifier; a battery testing device for acquiring test data on said battery unit; said battery tester having an input for capturing said unique identifier; a communication interface between said battery testing device and a computer network; a database for storing battery-related data associated with said unique identifier transmitted over said computer network, said battery-related data comprising: an ohmic test value, a baseline ohmic value, an aging factor for determining predicted failure data for said battery unit, and software for generating a predictive failure report from said battery-related data.

2. The battery management system of claim 1, wherein said ohmic test value is an impedance measurement.

3. The battery management system of claim 1, wherein said ohmic test value is a conductance measurement.

4. The battery management system of claim 1, wherein said ohmic test value is a resistance measurement.

5. The battery management system of claim 1, wherein said tag is in the form of a bar code.

6. The battery management system of claim 1, wherein said tag is in the form of an RFID.

7. The battery management system of claim 1, wherein said communication interface is a wireless communication interface.

8. The battery management system of claim 1, wherein said communication interface is a wired communication interface.

9. The battery management system of claim 1, wherein said software comprises an automatic notification feature that transmits said predicted failure data automatically upon input of said battery-related data.

10. The battery management system of claim 1, wherein said battery testing device is interfaced with a server having a network communication pathway for selectively transmitting said battery-related data across said network communication pathway and receiving data from said network communication pathway for transmission to a user.

11. The battery management system of claim 1, wherein said battery unit is an individual battery jar.

12. The battery management system of claim 1, wherein said battery unit is a battery string.

13. A method of predicting a failure of a battery unit, comprising steps of: acquiring a unique identifier from a tag associated with said battery unit; acquiring test data on said battery unit from a battery testing device; communicating battery-related data associated with said unique identifier over a computer network; storing said battery-related data in a database, said database in operable engagement with a software program; said battery-related data comprising: an ohmic test value, a baseline ohmic value, an aging factor for determining predicted failure data for said battery unit; said software program performing steps of: multiplying said aging factor by said ohmic test value to derive an aged ohmic test value; comparing said aged ohmic test value to said baseline ohmic value; applying a rule to determine an acceptable deviation; and reporting out a result, said result comprising predicted battery unit failure data.

14. The method of claim 13, wherein said ohmic test value is an impedance measurement.

15. The method of claim 13, wherein said ohmic test value is a conductance measurement.

16. The method of claim 13, wherein said ohmic test value is a resistance measurement.

17. The method of claim 13, wherein said tag is in the form of a bar code.

18. The method of claim 13, wherein said wherein said tag is in the form of an RFID.

19. The method of claim 13, wherein said step of communicating battery-related data associated with said unique identifier over said computer network is performed through a wireless communication interface.

20. The method of claim 13, wherein said step of communicating battery-related data associated with said unique identifier over said computer network is performed through a wired communication interface.

21. The method of claim 13, wherein said step of acquiring test data on said battery unit is performed by transmitting said test data to a server having a network communication pathway.

22. The method of claim 21, further comprising steps of selectively transmitting said battery-related data across said network communication pathway and receiving data from said network communication pathway for transmission to a user.

23. The method of claim 13, wherein said battery unit is an individual battery jar.

24. The method of claim 13, wherein said battery unit is a battery string.

* * * * *